United States Patent
Singh et al.

(10) Patent No.: US 6,826,025 B2
(45) Date of Patent: Nov. 30, 2004

(54) METHOD AND APPARATUS FOR PROVIDING ESD PROTECTION AND/OR NOISE REDUCTION IN AN INTEGRATED CIRCUIT

(75) Inventors: Raminderpal Singh, Essex Junction, VT (US); Steven Howard Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 121 days.

(21) Appl. No.: 10/063,857

(22) Filed: May 20, 2002

(65) Prior Publication Data

US 2003/0214767 A1 Nov. 20, 2003

(51) Int. Cl.[7] ................................................. H02H 9/00
(52) U.S. Cl. ......................................... 361/56; 361/111
(58) Field of Search ................................... 361/56, 111

(56) References Cited

U.S. PATENT DOCUMENTS

| | | | |
|---|---|---|---|
| 5,290,724 A | 3/1994 | Leach | 437/51 |
| 5,416,351 A | 5/1995 | Ito et al. | 257/357 |
| 5,430,595 A | 7/1995 | Wagner et al. | 361/56 |
| 5,452,171 A * | 9/1995 | Metz et al. | 361/56 |
| 5,475,255 A | 12/1995 | Joardar et al. | |
| 5,717,559 A | 2/1998 | Narita | 361/56 |
| 5,754,381 A * | 5/1998 | Ker | 361/56 |
| 6,049,119 A * | 4/2000 | Smith | 257/575 |
| 6,268,992 B1 * | 7/2001 | Lee et al. | 361/111 |

FOREIGN PATENT DOCUMENTS

| | | |
|---|---|---|
| EP | 0753892 | 1/1997 |
| JP | 6275787 | 9/1994 |

* cited by examiner

Primary Examiner—Robert L Deberadinis
Assistant Examiner—Boris Benenson
(74) Attorney, Agent, or Firm—Richard A. Henkler

(57) ABSTRACT

An integrated circuit having either or both ESD and noise suppression devices that use the inherent resistance in the substrate as an ESD trigger and/or part of the noise suppression.

5 Claims, 9 Drawing Sheets

METHOD AND APPARATUS FOR PROVIDING ESD PROTECTION AND/OR NOISE REDUCTION IN AN INTEGRATED CIRCUIT

BACKGROUND OF THE INVENTION

BACKGROUND OF THE INVENTION

1. Field of the Invention

The present invention generally relates to electrostatic discharge (ESD) protection circuits and, more particularly, to ESD circuits as they relate to integrated circuits.

2. Description of the Related Art

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits must be included in the device to protect the various components.

The use of System-On-A-Chip (SOC) for various applications such as high-speed high-speed data rate transmission, optical interconnect, wireless and wired marketplaces has expanded exponentially. Each one of these applications has a wide range of power supply conditions, number of independent power domains, and circuit performance objectives. Typically, different power domains are established between digital, analog and radio frequency (RF) functional blocks on an integrated chip. With system-on-a-chip (SOC), different circuit and system functions are integrated into a common chip substrate.

The use of a common substrate, however, introduces additional noise and ESD problems. Various methods have been used to address these additional concerns. For example, it is common within the industry to separate circuits spatially to avoid noise interactions and/or provide structures in-between to avoid current flow. Another method is to separate the power supply and ground connections to a circuit function using separate pads (or pins).

In order to avoid noise coupling from one ground to another, the grounds of the circuit functional blocks are typically separated and at times decoupled from the chip substrate by wells, tubs, isolated epitaxial regions in the semiconductor chip and also by using independent electrical interconnects of vias, wires and power pads.

The above noted methods are most prevalent where digital, analog circuit, and Radio Frequency (RF) blocks are used on the same integrated circuit or SOC.

The methods of separating the power and ground domains from one another introduces new ESD concerns. ESD testing of such an integrated circuit should be performed between pin-to-rail, rail-to-rail and pin-to-pin. Furthermore, the following ESD rules must be observed: (1) the current introduced from an ESD event cannot flow from any pin of one power domain to any pin of a different power domain; and (2) similarly, current introduced by the ESD event can not flow from one power domain to a different power domain (either dependent or independent).

It would be advantageous, therefore, if an ESD circuit could be constructed to sufficiently to protect integrated circuits having a common substrate. It would be further advantageous if such an ESD circuit could be combined with a noise reduction circuit. The present invention provides such an ESD circuit.

BRIEF SUMMARY OF THE INVENTION

In one aspect, the present invention uses the inherent resistance of the substrate to trigger an ESD device for circuits having separate power and/or ground pins from one another.

In yet another aspect, the present invention enhances the inherent resistance of the substrate, and uses the enhanced resistance as a trigger for an ESD device.

In yet a further aspect, the present invention uses low noise devices to keep noise from being introduced into a circuit.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

For the most part, details concerning timing considerations and the like have been omitted inasmuch as such details are not necessary to obtain a complete understanding of the present invention, and are within the skills of persons of ordinary skill in the relevant art.

The present invention uses the inherent resistance (or enhanced version) of a common substrate for triggering an ESD device and/or noise suppression circuitry. As previously discussed, such a common substrate is most typically used in applications that have some combination of digital, analog, and/or RF circuits, and the power and/or ground domains are separated one from another.

Figure 1:
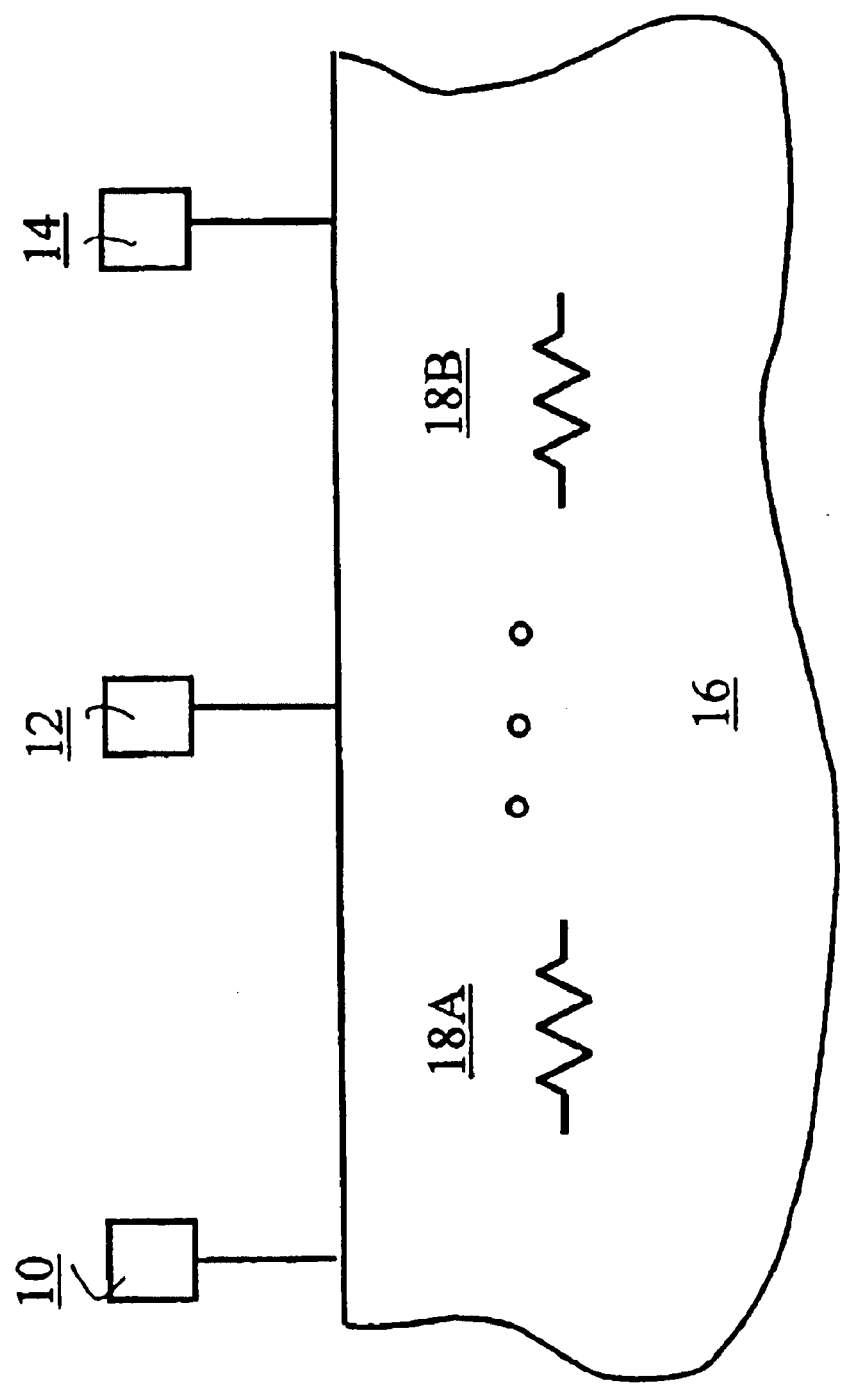
FIG. 1 is a block diagram of an integrated circuit is shown in which the present invention can be practiced.

Referring now to the drawings, and more particularly to FIG. 1, a block diagram of an integrated circuit is shown in which the present invention can be practiced. Specifically, a substrate region 16 which can be of either p-type or n-type is shown. Three pads (10, 12, and 14) are shown as being coupled to the substrate 16. For ease of explanation, it can be assumed, for example, that pads 10 and 14 are connected to a digital ground rail and an analog ground rail, respectively. An inherent substrate resistance is formed between pads 10 and 14 which is split into two resistive values 18A and 18B defined by pad 12. The present invention uses the resistive values 18A and 18B to trigger an ESD device as illustrated in FIG. 2.

Figure 2:
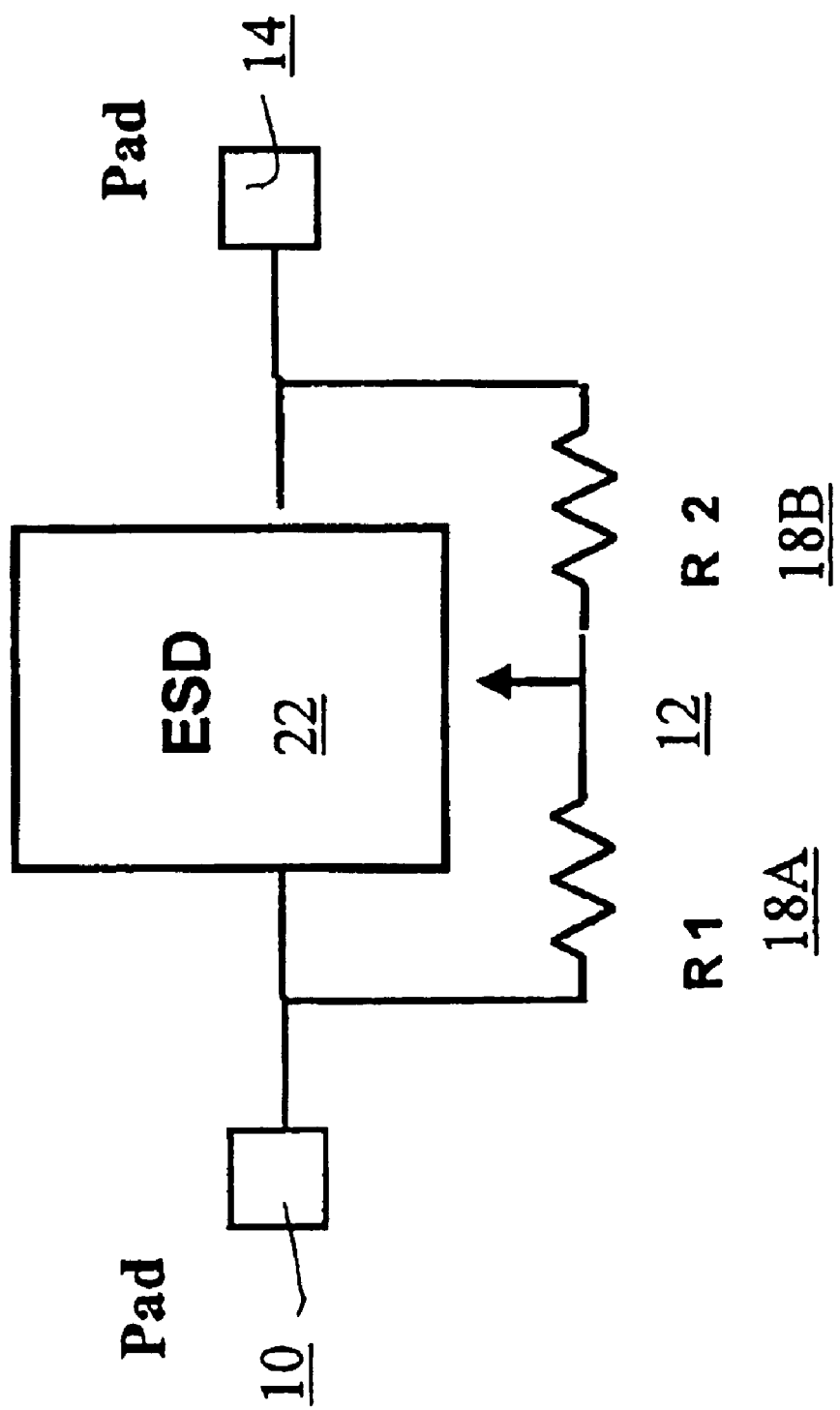
FIG. 2 is a block diagram illustrating an ESD device using the inherent resistance of the substrate according to the teachings of the present invention.

FIG. 2 is a block diagram illustrating an ESD device using the inherent resistance of the substrate 16 according to the teachings of the present invention. An ESD network 22 has been located between pads 10 and 14 which uses center node 12 as the trigger. The center pad 12 has a voltage potential that is a function of the spacing of the pad 10 to pad 12 relative to the spacing of pad 12 to pad 14. Consequently, the triggering voltage for the ESD network 22 can be altered (either symmetrical or asymmetrical) by varying the spacing and/or doping concentration in the substrate 16.

As an additional benefit provided by the center node 12 and ESD network 22, the newly created resistive elements 18A and 18B can also serve as a noise reduction function between pads 10 and 14.

Figure 3:
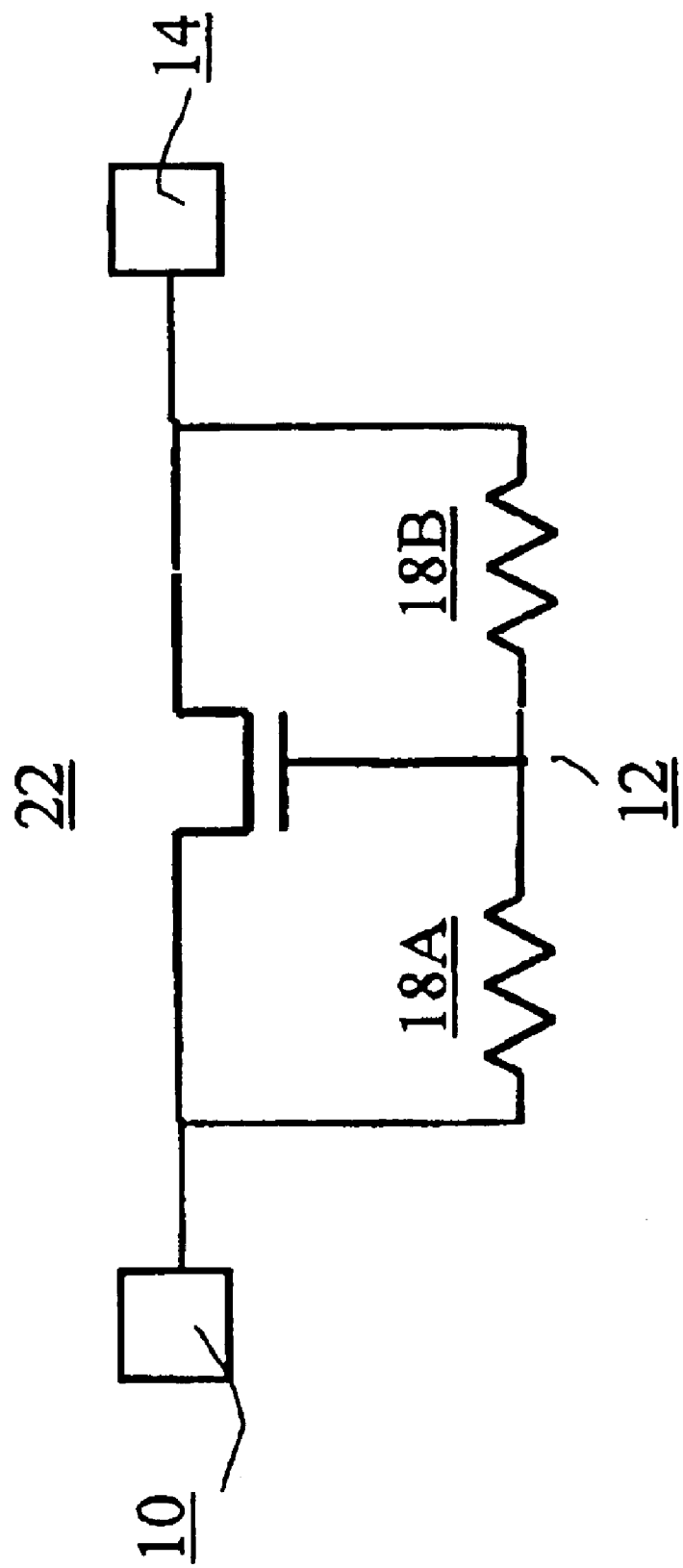
FIG. 3 is a schematic diagram illustrating an example of the ESD device of FIG. 2 as a MOSFET transistor according to the teachings of the present invention.

Reference now being made to FIG. 3, a schematic diagram is shown illustrating an example of the ESD device 22 as a MOSFET transistor according to the teachings of the present invention.

The resistor elements 18A and 18B, as previously discussed in connection with FIGS. 1 and 2, form center node 12. Resistor element 18A and 18B serve as a noise reduction function between pad 10 and 14. Pad 10 and 14 can be connected to circuit functions, power supplies or ground connections. Center node 12 of the noise reduction function also serves as a trigger element to initiate the MOSFET element 22. When the potential of center node 12 exceeds the MOSFET threshold potential, current is conducted between pads 10 and 14.

A plurality of ESD elements can be cascoded in a series or parallel configuration to further reduce the noise coupling between pads 10 and 14 as illustrated and explained in connection with FIG. 4.

Figure 4:
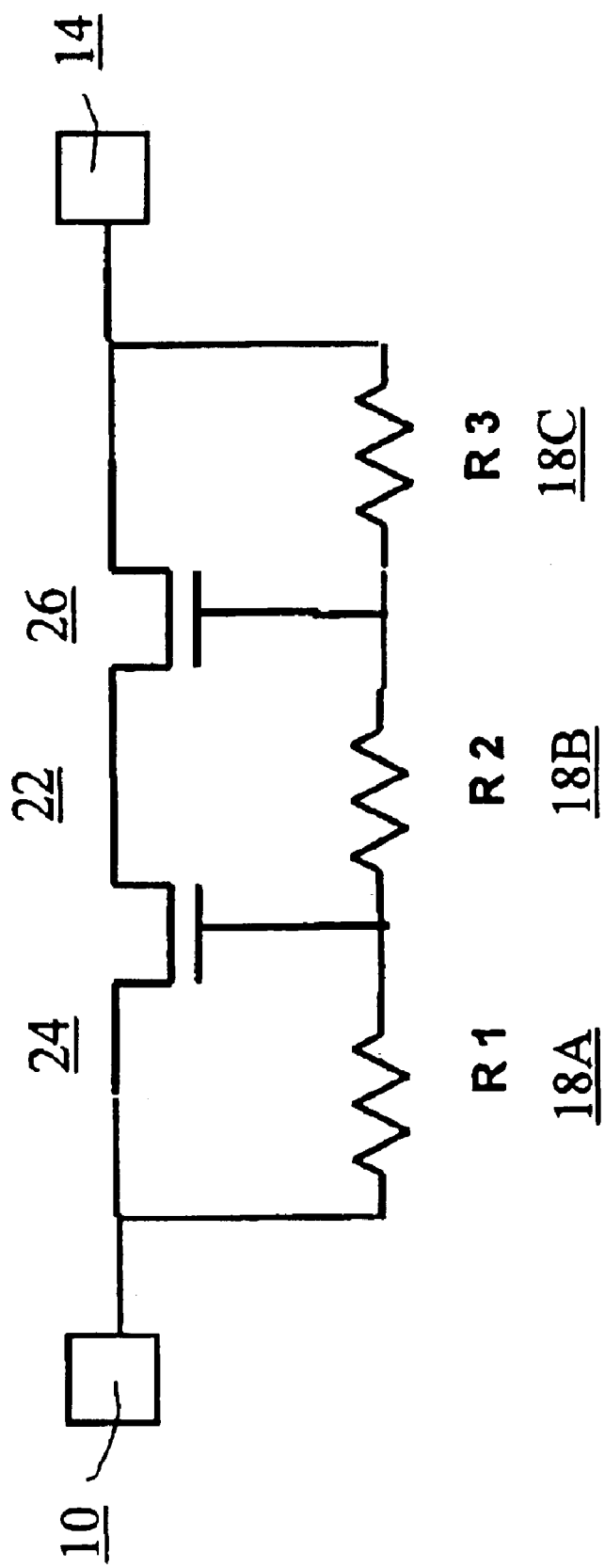
FIG. 4 is a schematic diagram illustrating an example of how a plurality of ESD elements can be cascoded in a series/parallel configuration between the pads of FIG. 2 according to the teachings of the present invention.

Reference now being made to FIG. 4, a schematic diagram is shown illustrating an example of how a plurality of ESD elements can be cascoded in a series/parallel configuration between pads 10 and 14 according to the teachings of the present invention.

ESD elements 24 and 26 are cascoded in series between pads 10 and 14. In this example, ESD elements 24 and 26 have been represented as MOSFETS. Resistor elements 18A–C have been defined by the placement of the gates for each of the respective MOSFETs 24 and 26 (which can include differing doping amounts for further enhancement of the resistive values), and serve as the triggering elements for MOSFETS 24 and 26.

Although the present invention has been discussed in connection with using the inherent resistance of the common substrate as a trigger for ESD devices, this resistance can be enhanced/increased through various means such as doping and/or array structures as illustrated and explained in connection with FIG. 5.

Figure 5:
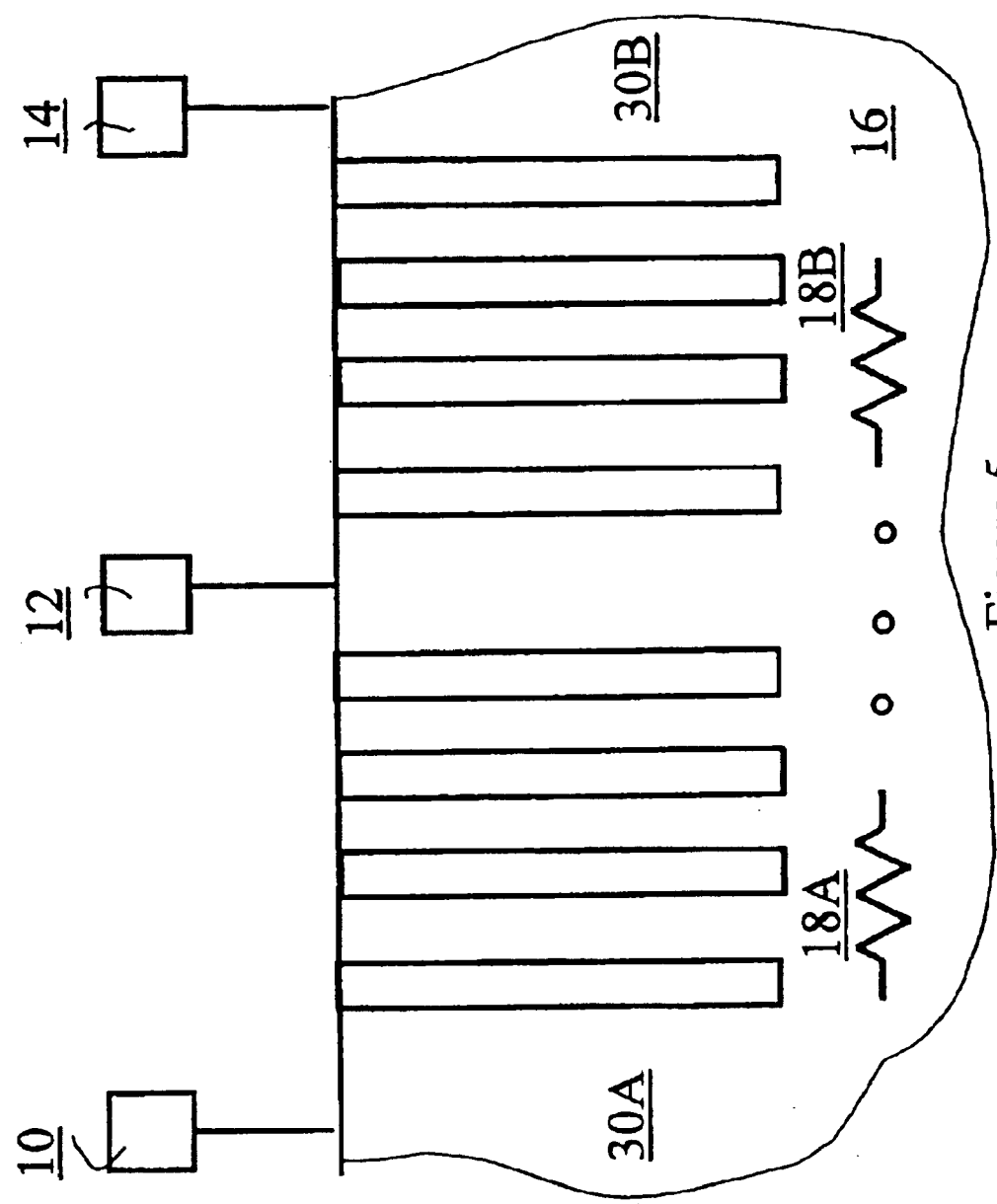
FIG. 5 is a block diagram illustrating an enhanced substrate resistance formed via an array of structures according to the teachings of the present invention.

FIG. 5 is a block diagram illustrating an enhanced substrate resistance 18A–B formed via an array of structures according to the teachings of the present invention. Located between pads 10 and 12 is a first array of structures forming resistor 30A. Also located between pads 12 and 14 is a second array of structures forming resistor 30B.

Resistors 30A and 30B increase the inherent resistance of 18A and 18B of the substrate.

These structures can be, for example, deep trench isolation structures, tapered trench regions, shallow trench isolation structures, insulator islands (e.g. Silicon on Insulator (SOI)) regions separated by substrate regions, triple well implanted bands, triple well structures, well structures, and isolated epitaxial regions or subcollector regions.

Deep trench structures, as used in DRAM cells, can have depths from 5 to 15 um. Deep trench structures used in bipolar transistors, typically range from 3 to 7 um. Tapered trench structures used in RF SiGe technology is typically 2 to 5 um deep. Well structures typically are less than 2 um to 12 um into the silicon surface.

Figure 6:
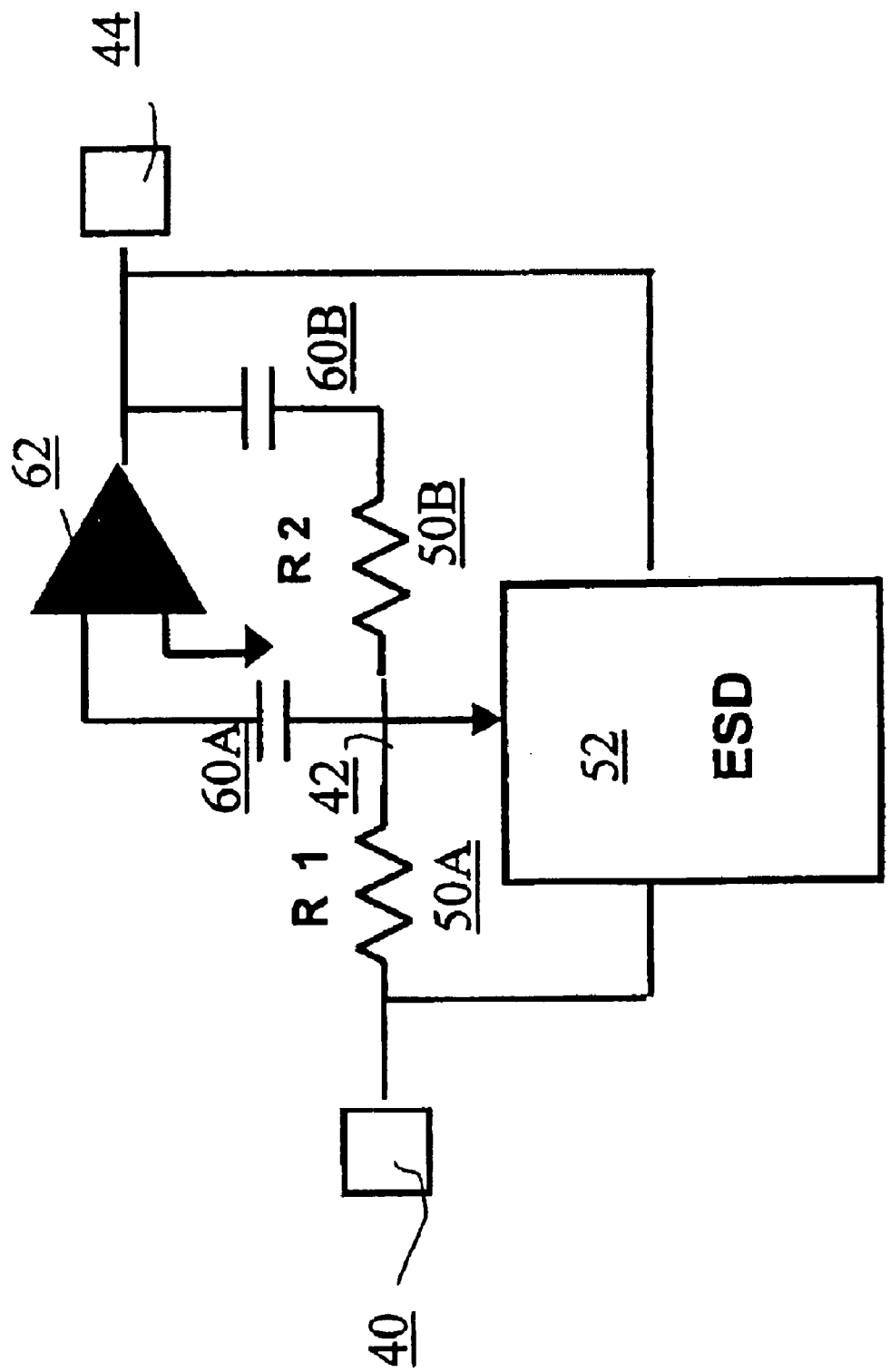
FIG. 6 is a schematic diagram illustrating the combination of an ESD device and noise suppression circuitry using the inherent or enhanced resistance of the common substrate according to the teachings of the present invention.

As discussed, the inherent or enhanced resistance of the common substrate can be used as a trigger for an ESD device. It is also advantageous to further use this resistance in combination with noise suppression circuitry as explained in connection with FIG. 6. FIG. 6 is a schematic diagram illustrating the combination of an ESD device 52 and noise suppression circuitry (62 and 60A–B) using the inherent or enhanced resistance of the common substrate according to the teachings of the present invention. ESD device 52 is located between pads 40 and 4. The placement of the triggering portion of the ESD device 52 defines resistors 50A–B. In addition to using Resistors 50A–B as the trigger for ESD device 52, they are coupled to capacitors 60A–B to form an RC network which is fed to amplifier 62. Amplifier 62 suppresses and inverts the signals to decrease the noise observed on pad.

In this embodiment, other ESD elements can be applied. For example, MOSFET structures, silicon controlled rectifiers, bipolar transistors and other forms of diode elements can be employed to achieve the spirit of this embodiment. Additionally, amplifier 62 can serve as an ESD function between its power rail and ground rail. Additional to the noise function, amplifier 62 will typically have cascoded MOSFETs in a drain-to-source configuration or bipolar transistors in common-emitter configuration. The size of the amplifier 62 can be defined to provide current flow between its own power supply rail and its own ground rail. In all embodiments below, this can be utilized to assist in providing ESD protection between a power rail (e.g. VDD) and its ground rail (e.g. VSS).

Figure 7:
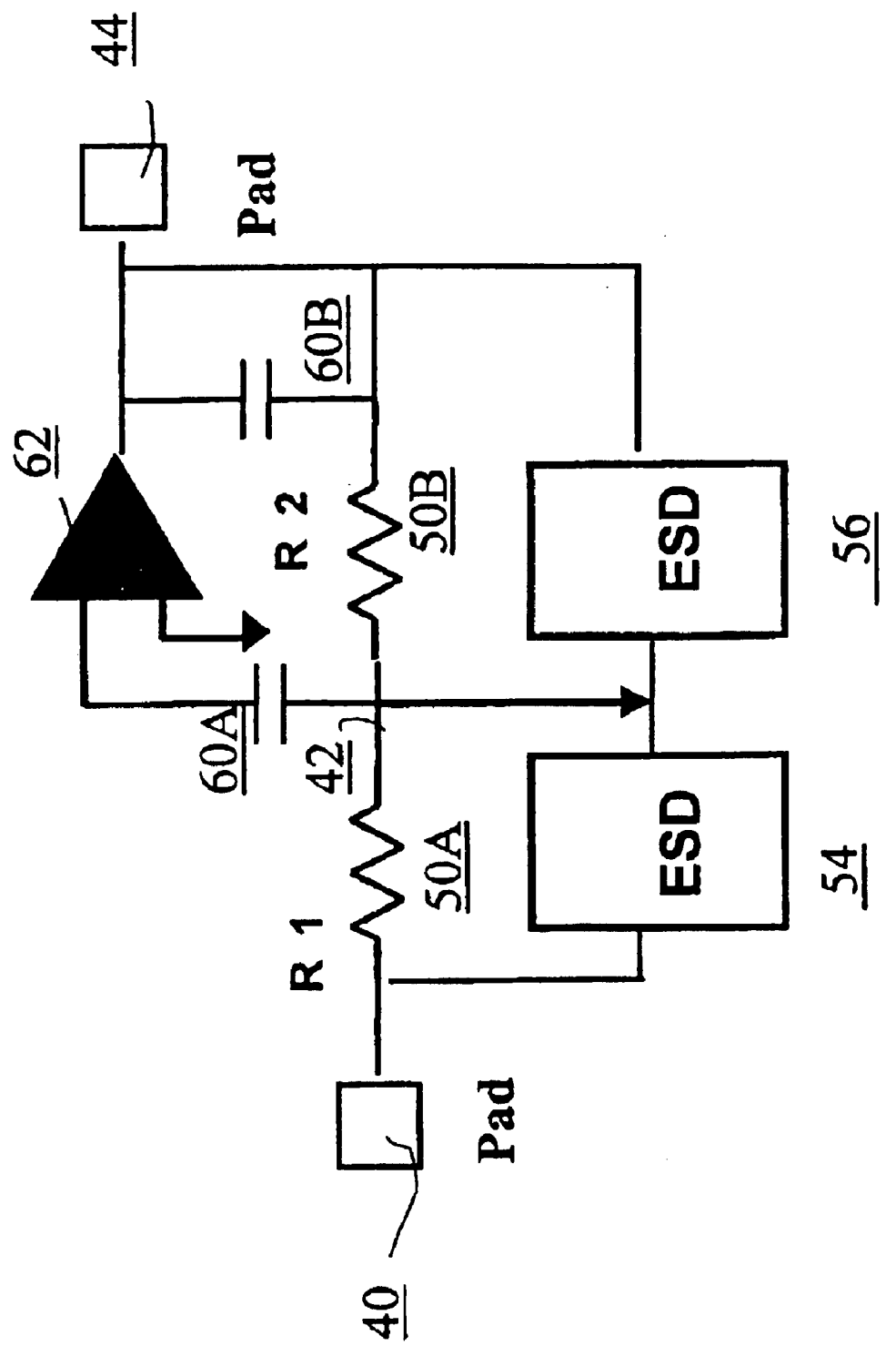
FIG. 7 is a schematic diagram illustrating the combination of a plurality of ESD devices and noise suppression circuitry using the inherent or enhanced resistance of the common substrate according to the teachings of the present invention.

FIG. 7 is a schematic diagram illustrating the combination of a plurality of ESD devices 54–56 and noise suppression circuitry (62 and 60A–B) using the inherent or enhanced resistance of the common substrate according to the teachings of the present invention. Elements 62, 60A–B, and 50A–B function as previously discussed in connection with FIG. 7. In this example, two ESD devices 54 and 56 have been placed in a cascoded series configuration between pads 40 and 44, and use the center node 42 as a trigger.

Figure 8:
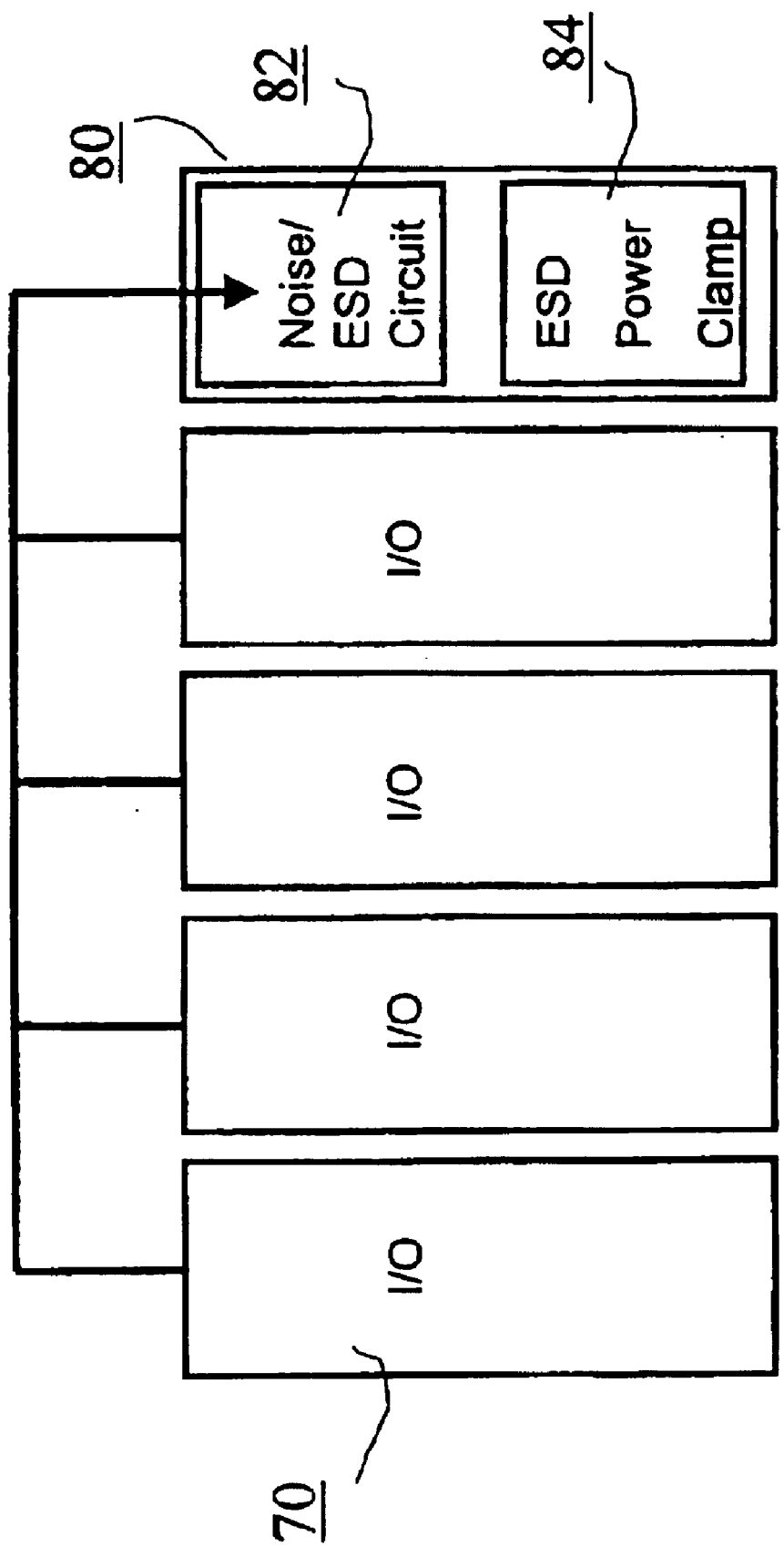
FIG. 8 is a block diagram illustrating a further embodiment in which the ESD and/or noise reduction circuits of FIGS. 7–8 can be used according to the teachings of the present invention.

FIG. 8 is a block diagram illustrating a further embodiment in which the ESD and/or noise reduction circuits of FIGS. 7–8 can be used according to the teachings of the present invention. In this embodiment, a structure is shown having a plurality of I/O circuits 70 and a service module 80. The plurality of I/O circuits 70 are connected to service module 80 where the signal is sent into the noise/ESD circuit 82 contained within service module 80. The service module 80 contains the noise/ESD circuit 82 and other ESD function 84. ESD function 84 can be, for example, ESD power clamps used between the VDD and VSS power supply. Noise/ESD Circuit 82 can be any of the implementations discussed above in connection with FIGS. 6–8.

This architecture can be used for SRAMs, DRAMs, logic, ASIC implementations, microprocessors, mixed signal products, BiCMOS applications and RF products. In this architecture, the digital noise from circuits are absorbed and processed in the noise suppression network. Additionally, the ESD protection is addressed in the service module by the ESD network initiated by the substrate resistor network. The circuits can consist of peripheral circuits such as off-chip driver and receiver networks. The service module can also provide power to the network.

In a noise suppression and ESD network, it is important that the elements used in the network are not significant sources of noise itself (i.e. degrading the noise environment of the system). Additionally, it is desired to use elements that minimize coupling between the power rails. Low noise elements should be used when possible to provide a low noise-suppression/ESD network. Low capacitance elements also minimize the capacitive coupling. These elements can be, for example, low noise transistors where a deuterium gate is used. Additionally, dual gate MOSFETs and triple gate MOSFETs can be used to lower the capacitive coupling and increase the threshold voltage of activation of the networks in FIGS. 1 to 8. Low noise diode structures can be implemented into the embodiments by using varactors with low series resistance and low capacitance. Low resistance diodes can be created using high doped subcollectors in varactor structures. Low capacitance is achievable using p-i-n diodes, non-pedestal bipolar Si varactors, STI-bound p+/retrograde n-well diodes and other low capacitance elements.

Figure 9:
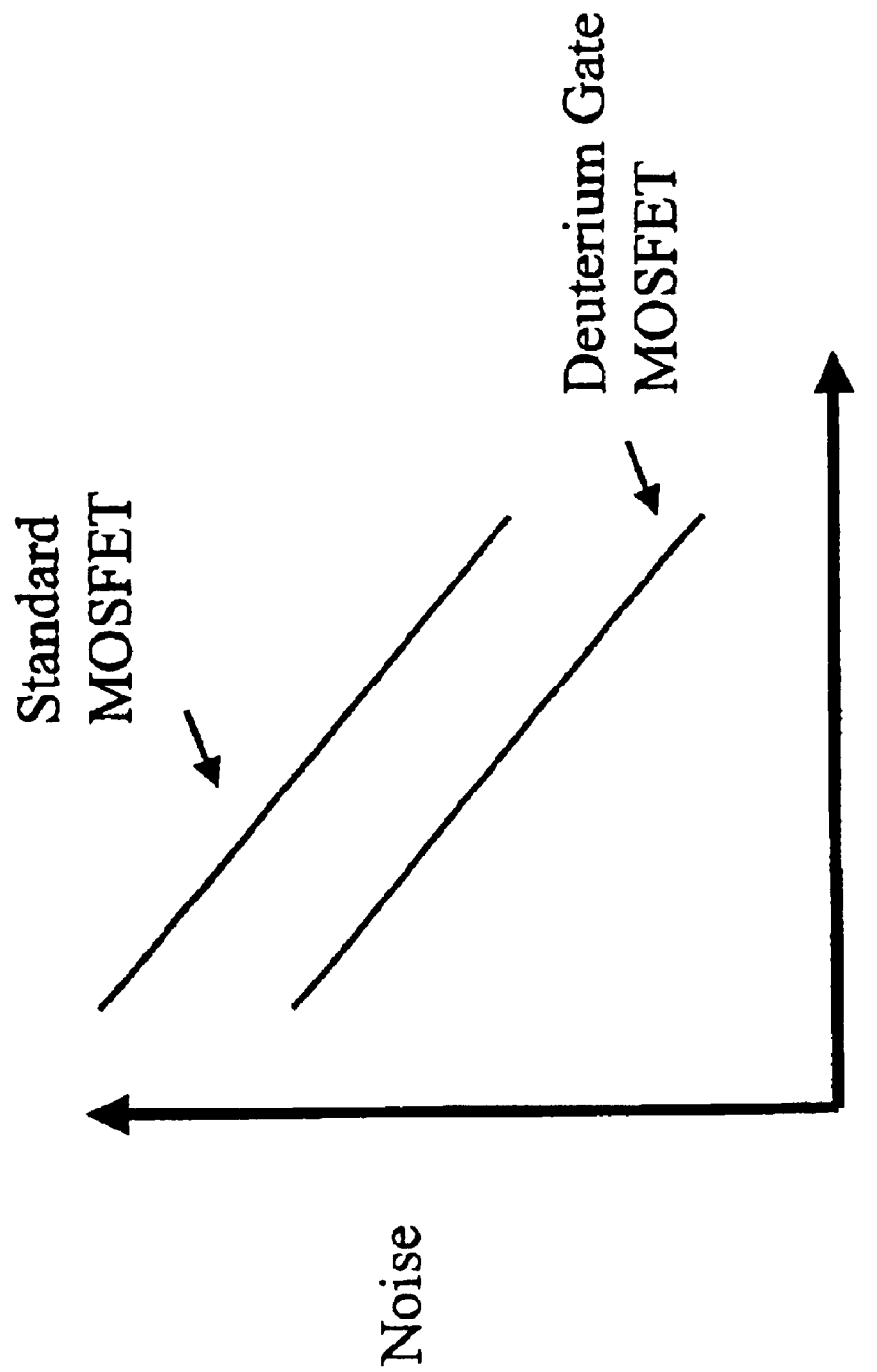
FIG. 9 is a plot diagram illustrating noise over 1/f for both a standard Silicon dioxide gate MOSFET structure and a deuterium gate MOSFET structure.

FIG. 9 is a plot diagram illustrating noise over 1/f for both a standard Silicon dioxide gate MOSFET structure and a deuterium gate MOSFET structure.

Various modifications may be made to the structures of the invention as set forth above without departing from the spirit and scope of the invention as described and claimed. Various aspects of the embodiments described above may be combined and/or modified.

What is claimed is:

1. An integrated circuit comprising:

a substrate;

a first pad coupled to the substrate;

a second pad coupled to the substrate;

a transistor having a source coupled to the first pad, a drain coupled to the second pad, and a gate coupled to the substrate;

a first resistance defined by the location of the coupling of the substrate to the gate in relation to the location of the first pad; and a second resistance defined by the location of the coupling of the substrate to the gate in relation to the location of the second pad.

2. The integrated circuit of claim 1 wherein the transistor is a MOSFET.

3. The integrated circuit of claim 2 wherein the MOSFET is comprised of deuterium.

4. An integrated circuit comprising:

an ESD device having a trigger for activation;

a noise suppression device;

a first pad coupled to the substrate;

a second pad coupled to the substrate;

a substrate coupled to the trigger and noise suppression device;

a first resistor defined by the coupling of the trigger and noise suppression device in relation to the first pad;

a second resistor defined by the coupling of the trigger and noise suppression device in relation to the second pad;

a third resistor coupled in series with the first resistor; and a fourth resistor coupled in series with the second resistor.

5. The integrated circuit of claim 4 wherein the third and fourth resistors are formed from trenches in the substrate.

* * * * *